United States Patent [19]
Hato

[11] Patent Number: 5,760,463
[45] Date of Patent: Jun. 2, 1998

[54] SUPERCONDUCTING LAYER IN CONTACT WITH GROUP III-V SEMICONDUCTOR LAYER FOR WIRING STRUCTURE

[75] Inventor: Tsunehiro Hato, Kawasaki, Japan

[73] Assignee: Fujitsu Limited, Kawasaki, Japan

[21] Appl. No.: 601,646

[22] Filed: Feb. 14, 1996

Related U.S. Application Data

[63] Continuation of Ser. No. 253,257, Jun. 2, 1994, abandoned.

[30] Foreign Application Priority Data

Sep. 10, 1993 [JP] Japan ................. 5-225513

[51] Int. Cl.$^6$ ............... H01L 39/00; H01L 29/06; H04B 1/00; H01P 1/00
[52] U.S. Cl. ............... 257/662; 257/663; 257/37; 505/230; 505/856; 505/866; 505/470; 505/220; 505/235; 505/236; 505/237; 505/813; 505/703; 505/704
[58] Field of Search ............... 505/150, 190, 505/220, 230, 231, 232, 235, 236, 237, 238, 329, 330, 430, 701, 702, 703, 704, 706, 812, 813, 832, 856, 861, 862, 864, 865, 866, 873, 874, 922, 923; 257/31, 32, 35, 661, 662, 663

[56] References Cited

U.S. PATENT DOCUMENTS

| | | | |
|---|---|---|---|
| 4,837,609 | 6/1989 | Gurvitch et al. | 257/663 |
| 5,024,993 | 6/1991 | Kroger et al. | 257/39 |
| 5,256,897 | 10/1993 | Hsegawa et al. | 257/35 |
| 5,380,704 | 1/1995 | Tarutani et al. | 257/36 |

FOREIGN PATENT DOCUMENTS

| | | | |
|---|---|---|---|
| 3-214677 | 9/1991 | Japan. | |
| 4-186883 | 7/1992 | Japan | 505/1 |
| 4-360589 | 12/1992 | Japan | 257/39 |
| 5-82842 | 4/1993 | Japan. | |

OTHER PUBLICATIONS

Matsuda et al., "Fabrication of NbN Josephson Tunnel Junctions and Their application to DC–Squids", Japanese Journal of Applied Physics vol. 25, No. 8, Aug. 1986, pp. 1188–1191.

Gijs et al., "yBa$_2$Cu$_3$O$_{7-\delta}$–Ag–Al/Al$_2$O$_3$/Pb Tunnel Junctions Based on the Superconducting Proximity Effect," Applied Physics Letters, vol. 57, No. 24, Dec. 10, 1990, pp. 2600–2602.

*Primary Examiner*—Carl W. Whitehead
*Assistant Examiner*—Alice W. Tang
*Attorney, Agent, or Firm*—Staas & Halsey

[57] ABSTRACT

A superconductor device which includes a first wiring part and a second wiring part which together form a superconductive wiring. The first wiring part is arranged onto a substrate and is made of a superconductor material. The second wiring part is made of a non-oxide semiconductor material. The second wiring part is adjacent to the first wiring part and jointly forms a superconductive wiring with the first wiring part by becoming at least partly superconductive due to proximity effect with the first wiring part. The second wiring part has a smaller penetration length of magnetic field than that for the first wiring part. This structure enhances the propagation velocity of a signal within the superconductive wiring.

19 Claims, 10 Drawing Sheets

SUPERCONDUCTING LAYER IN CONTACT WITH GROUP III-V SEMICONDUCTOR LAYER FOR WIRING STRUCTURE

This application is a continuation of application Ser. No. 08/253,257, filed Jun. 2, 1994, now abandoned.

BACKGROUND OF THE INVENTION a) Field of the Invention

The present invention relates to an information apparatus which requires a high speed signal treatment, and more specifically to an information apparatus which requires a high speed signal treatment with a short delay of signal due to wiring.

b) Description of the Related Art

For such an information treating apparatus represented by computers, a higher speed of signal treatment is being required. As the signal treatment needs to be faster, delay of signal due to wiring poses a greater problem. Especially, as integration of circuit goes on and as line width of wiring is reduced accordingly, delay of signal due to resistance of wiring or the like becomes a larger problem.

Layer of Al having a low resistivity is often used as wiring in a semiconductor integrated circuit. However, with an increase of integrity of circuit, line width of wiring gradually is reduced. And, thereby, resistance R of wiring becomes of importance. For example, an Al wiring with a line width of 500 nm and with a thickness of 500 nm has a resistance of about 1 kΩ. Wiring also accompanies a capacitance C. With an increase of a time constant RC, delay of signal to attain a fixed potential becomes larger. Dispersion of signal, and generation of heat due to resistance also cause problems.

Superconductor is drawing attention as material for Wiring with a remarkably small, or no resistance. When a superconductor with no resistance is used for wiring, it is possible to obtain a wiring with no loss and no distortion.

Figure 2A:
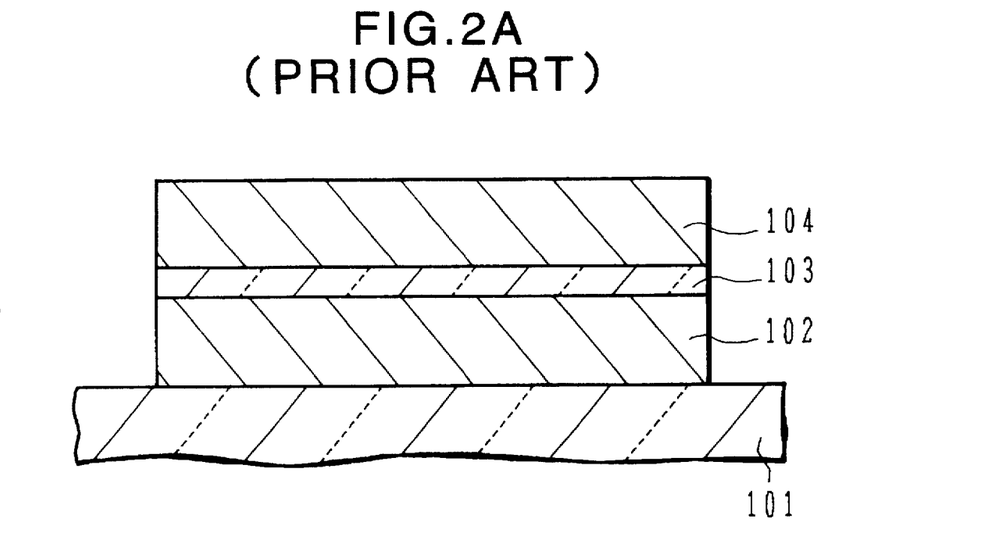
FIG. 2A is a sectional view showing structures of superconductor wiring according to prior art technique.

FIG. 2A shows an example of composition of prior art superconductor wiring. In FIG. 2A, a substrate 101 physically supports a superconductor layer 102, a dielectric layer 103, and another superconductor layer 104, which are laminated thereon.

The superconductor layers 102 and 104 interpose the dielectric layer 103 to form transmission lines. Since the superconductor Layers 102 and 104 form transmission lines with a "0" resistance, it is possible to configurate a wiring with no loss and no distortion. It is possible to reduce delay of signal due to wiring by making the circuit smaller with a shorter wiring.

Figure 2B:
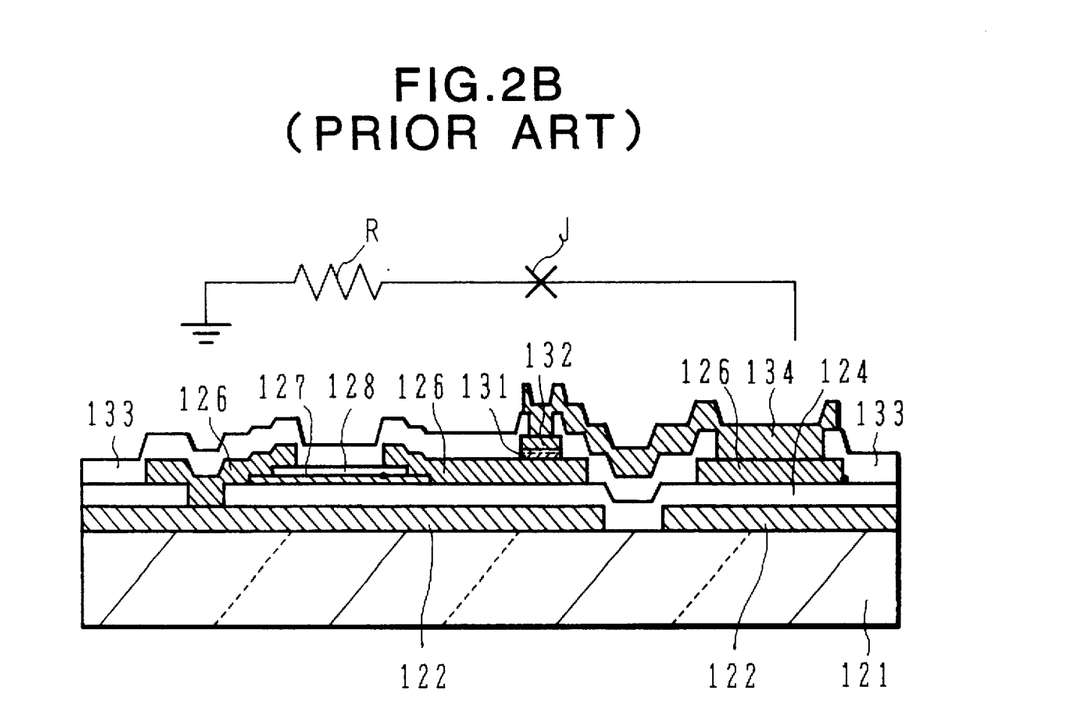
FIG. 2B is a sectional view showing structures of superconductor wiring according to prior art technique.

FIG. 2B shows a sectional view of a part of a prior art circuit of a Josephson element which utilizes a superconductor. A superconductor layer 122 as a ground wiring is formed on a substrate 121. An inter-layer insulating film 124 covers the superconductor layer 122. The inter-layer insulating film 124 has an opening at required part, and has a resistance Layer 127 and its surface protecting film 128 formed on other part thereof.

On this configuration is formed a superconductor layer 126 as another wiring layer to connect the ground wiring 122 and the resistance layer 127, and also to connect the resistance layer 127 With a Josephson junction element J which is formed thereon.

The Josephson junction element J is configurated by forming an aluminium layer 131 comprising an aluminium oxide layer on the superconductor 126 at the center, and by forming a superconductor layer 132 thereon. The Josephson junction element J is connected to the other superconductor layer 126 on the right hand side by way of a superconductor wiring layer 134.

Another inter-layer insulating film 133 is formed underneath the superconductor layer 134. With a configuration stated above, a circuit with a series connection of the resister R and the Josephson junction element J is formed.

In this configuration, the substrate can be formed by Si, for example, the superconductor layers 122, 126, 132 and 134 can be formed by Nb, for example. The resistor 127 can be formed by Mo, for example. And the insulating layer, such as inter-layer insulating film, can be formed by $SiO_2$, for example.

Here, there is a problem in reducing the size of wiring of superconductor. When the thickness of superconducting wiring is reduced, the propagation velocity or signal is reduced in relation to a penetration length of magnetic field. Even though with "0" resistance, the circuit cannot be expected to work fast when the propagation velocity of a signal is slow.

SUMMARY OF THE INVENTION

The purpose of the present invention is to provide a superconductor wiring device which enables an enhancement of propagation velocity of signal within wiring.

According to one aspect of the present invention, a superconductor wiring device comprised with a substrate, a first wiring part which is arranged on the substrate and formed with a super conductor, and a second wiring part which is formed by a semiconductor, is arranged on the substrate at a position near to the first wiring part, and becomes superconductive by proximity effect at least partly is provided.

When a semiconductor is arranged adjacent to a superconductor, a superconducting state is obtained by the semiconductor by a proximity effect which is caused by super positions of wave function. It is possible to utilize preferable characteristics of the both materials of superconductor and semiconductor by employing such semiconductor for wiring.

Thus, wiring with no loss and no distortion is formed using a semiconductor.

When a semiconductor material with a small effective mass, or with a high carrier mobility is used, a signal transmission line with a larger propagation velocity can be formed compared to the case of using superconductor.

In a signal treating circuit with superconductor element or with semiconductor element and so on, it is possible, by using wiring explained above, to attain an enhancement of the velocity of circuit by reducing a generation of heat, an enhancement of the fidelity of signal treatment, and an enhancement of the velocity of treating signals. Thus, the present invention contributes much to enhance characteristics of signal treating device represented by computers.

DESCRIPTION OF THE PREFERRED EMBODIMENTS

A prior art superconductor wiring as shown in FIG. 2A is considered first. Phase velocity Vph and group velocity Vgr within a superconductor wiring of a parallel plate type as shown in the diagram are expressed, if surface resistance can be neglected, as follows:

$$Vph = Vgr = (\mu_0 \epsilon)^{1/2} [1 + (2\lambda/d) \cot h(b/\lambda)]^{-1/2} \quad (1)$$

Here, thicknesses of superconductor layers are both designated by b, a thickness of dielectric layer by d, a dielectric coefficient of dielectric substance by $\epsilon$, and a penetration depth of magnetic field by $\lambda$.

As will be obvious from the above formula, it is effective to increase the thickness d of the dielectric layer and to reduce the penetration length $\lambda$ of magnetic field to attain a signal propagation of a high speed. It is also preferable to increase the thickness b of the superconductor layer compared to its pentration length $\lambda$, of magnetic field.

The pentration length $\lambda$ of magnetic field at its dirty limit is expressed by the following formula:

$$\lambda = (m^*/\mu_0 ns^* e^{*2})^{1/2} (\xi_0/\ln)^{1/2} \quad (2)$$

Here, m* denotes effective mass of carriers, µ 0 mobility of carriers, ns* effective carrier density of superconductor carriers, $\xi$ 0 intrinsic coherent length, and ln denotes mean free path.

It is effective for reducing the pentration length $\lambda$ of magnetic field that a material with a smaller effective mass of carriers m* is employed. And the effective carrier density of carriers in a superconductor is to be as much higher as could be.

When a superconductor and a semiconductor is junctioned, a part within the superconductor up to a certain depth which corresponds to a coherent length of the superconductor influences a part within the semiconductor up to a certain depth which corresponds to a coherent length of the semiconductor, and, as a result, the part within the semiconductor which corresponds to its coherent length behaves as a superconductor. This phenomenon is called a proximity effect.

The present invention proposes to arrange a semiconductor adjacent to a superconductor, and to utilize the semiconductor for wiring as a superconductor.

Figure 1A:
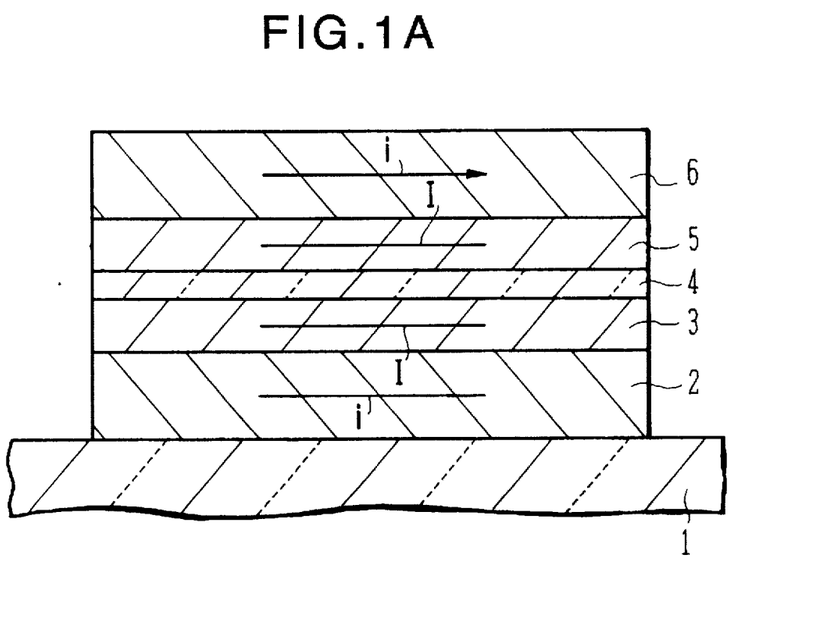
FIG. 1A is a sectional view showing a wiring structure of a basic embodiment according to the present invention.
Figure 1B:
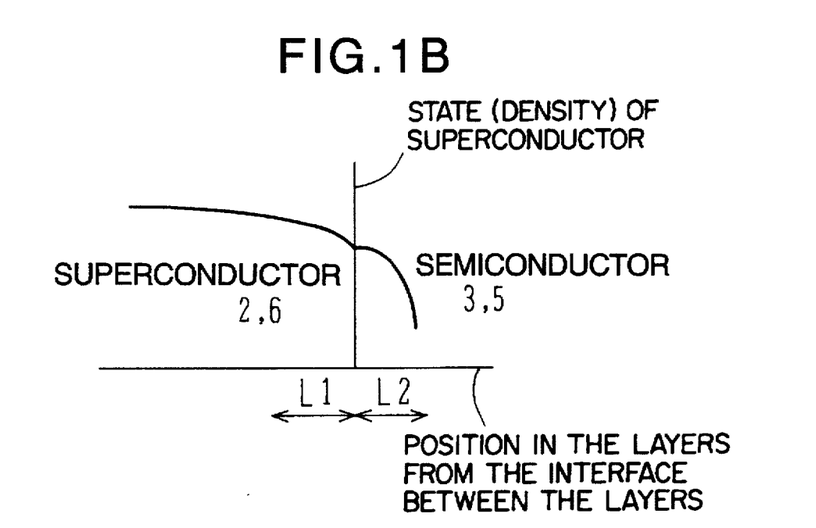
FIG. 1B is a schematic diagram showing a function of a basic embodiment according to the present invention.

FIGS. 1A and 1B shows a basic embodiment according to the present invention. FIG. 1A is a sectional view showing a wiring structure, and FIG. 1B is a line diagram showing schematically the level of superconductivity within layers of FIG. 1A.

In FIG. 1A, a substrate 1 physically supports a superconductor layer 2, a semiconductor layer 3, a dielectric layer 4, a semiconductor layer 5, and a superconductor layer 6, which are laminated consecutively in this order thereon. The superconductor layer 2 and the semiconductor layer 3 at the lower side, conjuncted to each other, plays a role of the lower wiring layer 102 of prior art superconductor wiring shown in FIG. 2A. The superconductor layer 6 and the semiconductor layer 5 at the upper side, conjuncted to each other, plays the role of the upper wiring layer 104 of prior art superconductor wiring shown in FIG. 2A.

The semiconductor layers 3 and 5, under an influence which allow current i to flow therethrough of adjacent superconductor layers 2 and 6, which allow current i to flow therethrough partly becomes and allow current I to flow therethrough superconductive and allow current I to flow therethrough.

FIG. 1B shows schematically the state of the superconductor layer and the semiconductor layer at their vicinity of interface. The semiconductor layers 3 and 5 are arranged adjacent to the superconductor layers 2 and 6. Coherent length of the superconductor layers 2 and 6 are designated by L1 and coherent length of semiconductor layers 3 and 5 by L2.

Within a distance or the coherent length 12, the semiconductor layers become superconductive under influences by parts of coherent length L1 of the superconductor layers 2 and 6. The coherent length is not a value corresponding to a drastic change in the level of superconducting state, but refers to a range with a specific proportion of the level.

In reality, consequently, the semiconductor layers are supposed to be superconductive up to a thickness several times the coherent length. When the thickness of the semiconductor layers is sufficiently thin, the whole of the semiconductor layers is superconductive.

In a semiconductor thus become superconductive, the phase velocity and the group velocity are expressed by a formula as shown by formula (1), an di thé penetration length of magnetic field by formula (2).

Namely, the penetration length of magnetic field $\lambda$ is proportional to the power of ½ of the effective mass m* of semiconductor carriers, and is inversely proportional to the power of ½ of the mobility µ 0 of carriers and the carrier density ns*.

In general, semiconductor has a smaller carrier density ns* than metal. Mobility µ 0 and effective mass m*, however, differs with the kind of semiconductor. It is possible to reduce the value of penetration length $\lambda$ of magnetic field and to enhance propagation velocity when a material With a small effective mass m* and a large mobility µ 0 is obtained.

For example, when InSb is selected as a material for the semiconductor layers 3 and 5 to arrange adjacent to the superconductor layers 2 and 6 of Nb, the penetration length of magnetic field of the semiconductor layers 3 and 5 can be set to be less by one tenth of that estimated to the superconductor layers 2 and 6.

The above value is obtained when the carrier density of a semiconductor layer InSb is estimated to be about $5 \times 10^{17}$ cm$^{-3}$, in which the effect of a small carrier density to increase the penetration length of magnetic field surpasses the effect of a small effective mass to reduce the penetration length of magnetic field.

The fact that the penetration length of magnetic field can be reduced to $\frac{1}{10}$ means that the size of wiring can be reduced to $\frac{1}{10}$. With the same thickness of wiring layer, a higher propagation velocity of signals is obtained.

As for a substrate, it is possible to employ a dielectric substrate of such material as MgO, or a semiconductor substrate of such material as Si. A dielectric layer is possible to be formed by a dielectric substance of such material as SiO$_2$, or by a semiconductor with a high resistivity.

Figure 3:
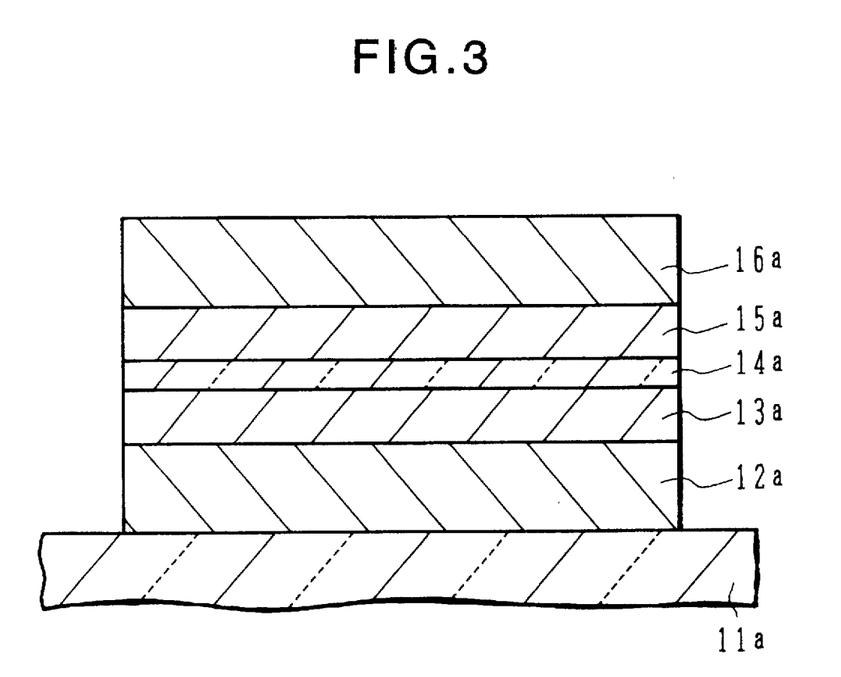
FIG. 3 is a sectional view showing an example of configuration of superconductor wiring according to the present invention.

FIG. 3 shows a more concrete embodiment of wiring structure. Oil the surface of a substrate 11a formed by semiconductor or dielectric substance, a Nb layer 12a which is a superconductor layer with a thickness of about several 100 nm, an InSb layer 13a which is a semiconductor layer with a thickness from single atomic layer of about 0.1 nm up to 10 nm, and a MgO layer 14a which is a dielectric ayer with several 100 nm are laminated consecutively.

Further, on the MgO layer 14a, InSb layer 15a of semiconductor with a thickness from single atomic layer of about 0.1 nm tip to 10 nm, and a Nb layer 16a with a thickness of several 100 nm are laminated consecutively.

For example, when a wiring device as shown in FIG. 3 is cooled down to the liquid helium temperature, the Nb layers 12a and 16a which have a critical temperature of about 9° K, are maintained to be superconductive. When InSb layers 13a and 15a doped with an impurity concentration of about 1×10$^{18}$ cm$^{-3}$ are employed, the coherent length of the InSb layers is estimated to be about 200 nm. Consequently, the InSb layers 13a and 15a are considered to be almost completely superconductive.

With a coherent length of about 200 nm, the thickness of the semiconductor layers may be thicker.

In the above description, InSb is employed as a semiconducting material. It is, however, not limited to this material as long as a semiconducting material with a smaller effective mass and a higher mobility is employed. It is possible, for example, to use such materials as InAs, GaAs, Inp or a mixed crystal of these materials.

It is also possible to use other materials than Nb as a superconductor. For example, other superconducting materials such as NbN, or an oxide superconductor can also be used. In the case of oxide superconductor, it is possible to attain a superconducting state at a higher temperature, and to obtain a wiring device which yields a superconducting state to the semiconductor at a higher temperature.

Figure 4:
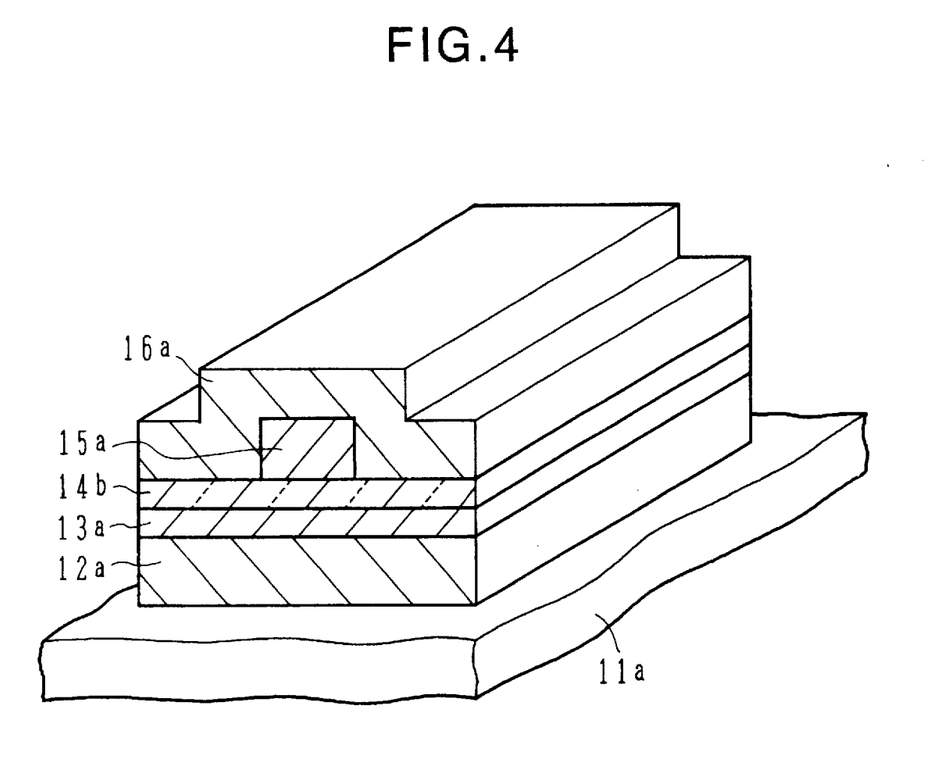
FIG. 4 is a sectional view showing an example of configuration of superconductor wiring according to the present invention.

FIG. 4 shows a variation of the configuration of FIG. 3. On a substrate 11a formed by a semiconductor or a dielectric material such as Si and MgO, an Nb layer 12a with a thickness of 100 nm, an InSb layer 13a with a thickness of 10 nm are laminated as in the case or the embodiment shown in FIG. 3. An InSbO$_x$ with a thickness of 5 nm is laminated thereon.

On the InSbO$_x$ layer 14b, an InSb layer 15a thicker than InSbO$_x$, for example, with a thickness of 10 nm is formed in a shape of stripe with a width of 1000 nm, which, in turn, is covered by an Nb layer 16a on its lateral and upper surfaces. With this configuration, InSb 15a is driven to be superconductive by the Nb layer 16a which covers its upper and lateral surface.

Figure 5:
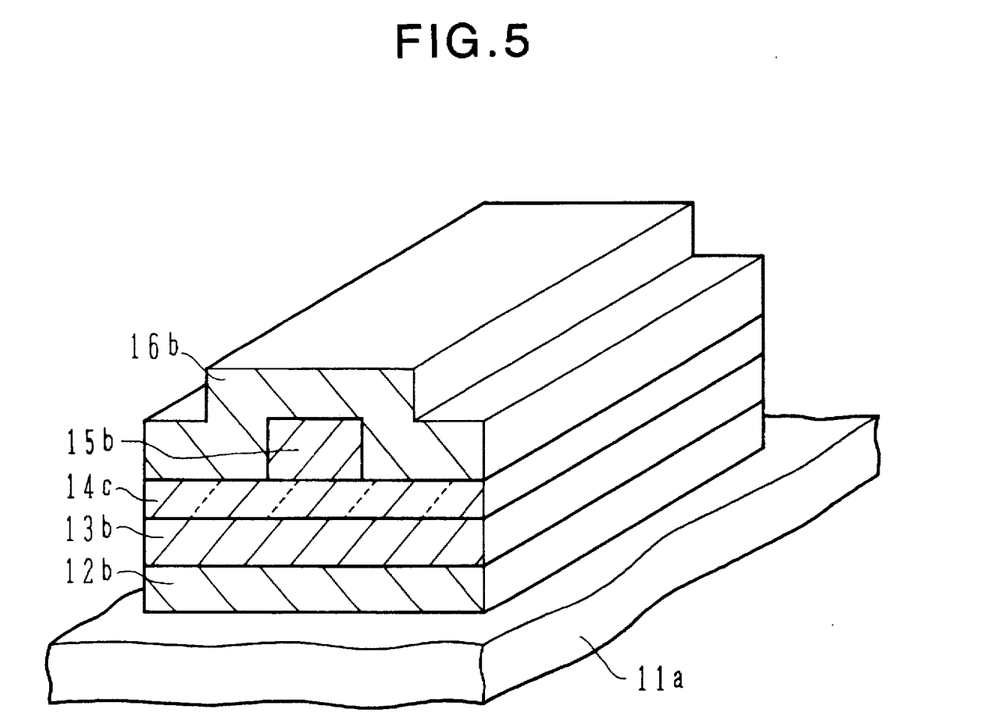
FIG. 5 is a sectional view showing an example of configuration of superconductor wiring according to the present invention.

It is also possible to form a configuration as shown in FIG. 5. In FIG. 5, on a substrate 11a, a NbN layer 12b with a thickness of 100 nm is formed as a superconductor layer, and an InAs layer 13b with a thickness of 5 nm is laminated thereon as a semiconductor layer.

On the InAs layer 13b is formed a stripe-shaped pattern of an InAs layer 15b with a thickness of 5 nm and with a width of 1000 nm interposing a GaSb layer 14c with a thickness of 20 nm. An NbN layer 16b is formed on the InAs layer 15b with a thickness of 100 nm covering its lateral and upper surfaces.

This configuration employs an NbN as a superconductor and all InAs as a semiconductor, both forming a wiring in a superconducting state. The GaSb 14c in the middle plays the role of a dielectric film.

In configurations shown by FIGS. 3, 4 and 5, it is possible to form the superconductors Nb and NbN, the dielectrics MgO and so on by using such method as sputtering. The semiconductor layers such as InSb layers or InAs layers are possible to be formed by such a method as molecular beam epitaxy (MBE). Semiconductor layers are patterned by employing such dry treatment as ion milling. And semiconductor layers which are used as dielectric layers can either be formed by sputtering or such methods as MBE or chemical vapor deposition (CVD).

Figure 6:
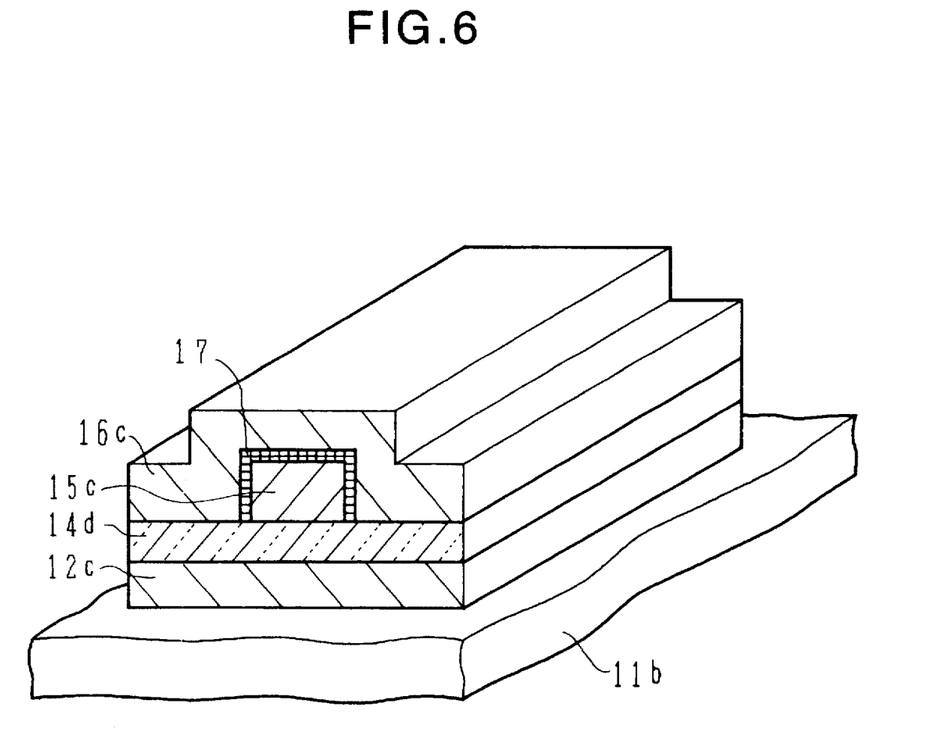
FIG. 6 is a sectional view showing an example of configuration of superconductor wiring according to the present invention.

FIG. 6 shows a further example of configuration. This configuration forms, on a substrate 11b, a YBCO (yittrium-bismuth-copper-oxide) layer 12c with a thickness of 100 nm as a superconductor layer, and a CeO$_2$ layer 14d thereon with a thickness of 30 nm as a dielectric layer.

A semiconductor wiring layer 15c is formed by forming and patterning a GaAs layer with a thickness of 5 nm and with a width of 2000 nm on the (CeO$_2$ layer 14d. Surfaces of the GaAs layer 15c is covered with a metal buffer layer 17 which has an oxygen-screening ability with a thickness of 2 nm, and a YBCO layer 16c is grown thereon with a thickness of 200 nm. The YBCO layer 16c first grows on the CeO$_2$ layer, and covers both the GaAs layer 15c and the metal buffer layer 17 completely after starting to grow also in transverse direction.

In a configuration shown in FIG. 6, the metal buffer layer 17 is provided to prevent the surface of a semiconductor layer of the GaAs layer 15c to be oxidized by a superconductor layer of the YBCO layer 16c. However, the metal buffer layer 17 may be eliminated when the change on a surface of the semiconductor layer becomes of no significance by selecting materials, or by adjusting a method of growth, of the semiconductor layer and the superconductor layer.

In the above examples of configuration, a single semiconductor layer doped with impurity is employed as a semiconductor layer. It is also possible to employ a laminated semiconductor layer having two-dimensional electron gas as a semiconductor layer.

Figure 7:
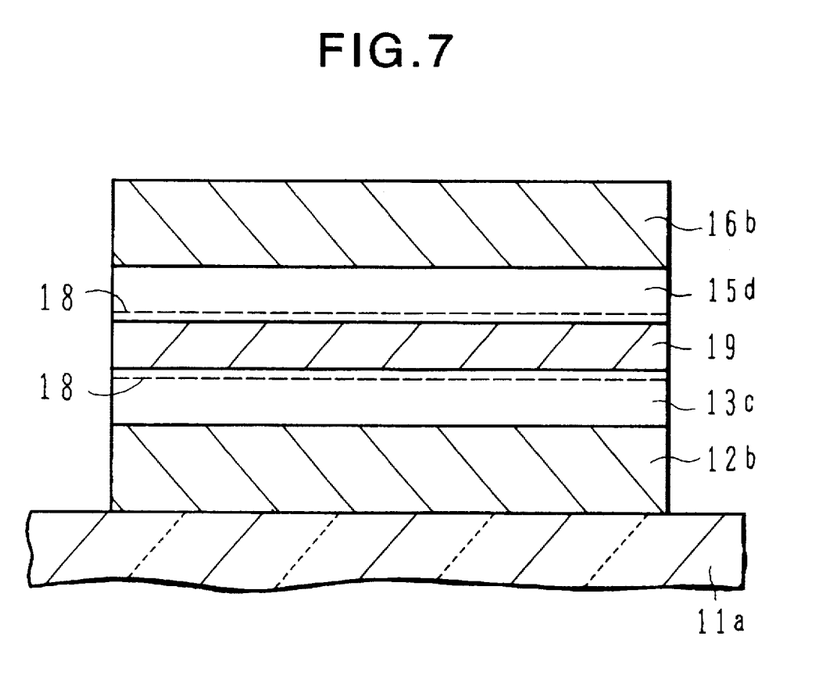
FIG. 7 is a sectional view showing an example of configuration of superconductor wiring according to the present invention.

FIG. 7 shows an example of a wiring structure utilizing a two-dimensional electron gas. On a surface of a substrate 11a, there are laminated a superconductor NbN layer 12b with a thickness of 100 nm, a high mobility semiconductor GaAs layer 13c with a thickness of 3 nm, an n-type AlGaAs layer 19 to supply carriers with a thickness of 5 nm, a high mobility semiconductor GaAs layer 15d with a thickness of 3 nm, and a superconductor NbN with a thickness of 100 nm. Here, an n-type AlGaAs layer 19 has a band gap larger than GaAs and provides carriers to adjacent semiconductor GaAs layers 13c and 15d.

Narrow potential wells are formed in the GaAs layers 13c and 15d at their boundary region to the n-type AlGaAs layer 19, which potential wells in turn trap carriers supplied by the n-type AlGaAs layer 19 to form two-dimensional electron gases 18.

By adjusting the thicknesses of the GaAs layers 13c and 15d to the thicknesses small enough to be under control of proximity effect due to the NbN layers 12b and 16b, the GaAs layers 13c and 15d behaves as superconductors under the influence of the proximity effect. The two-dimensional. electron gas in the layers is transported superconductively. The n-type AlGaAs layer which supplies carriers plays the role of a dielectric layer.

According to this configuration, it is possible to obtain a high propagation velocity because of an extremely small penetration depth λ of magnetic field obtained by the fact that the two-dimensional electron gas has an enormously higher mobility than that for usual type carriers.

Figure 8:
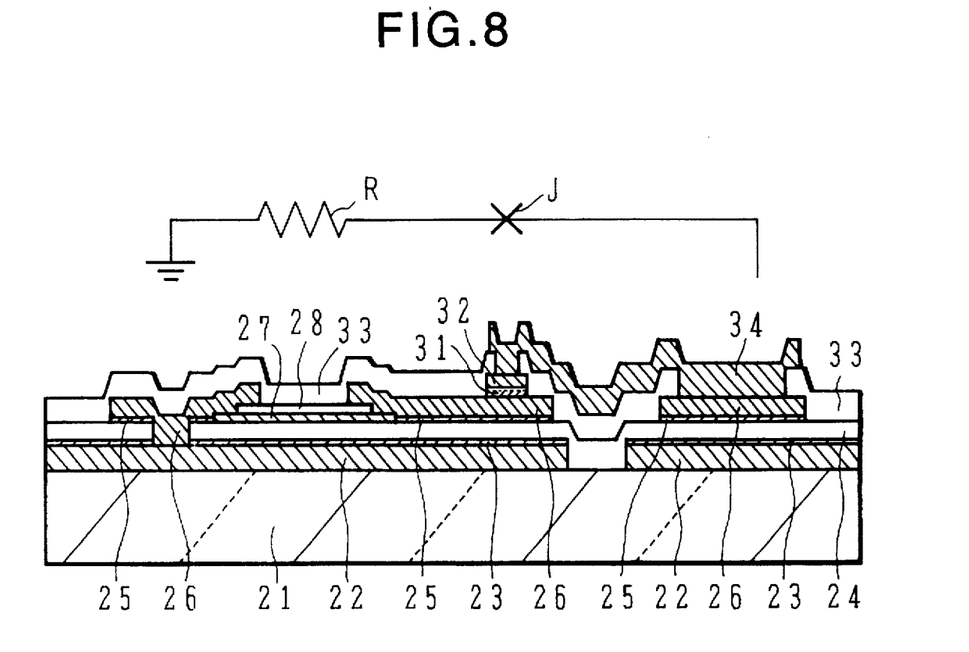
FIG. 8 is a sectional view of a circuit utilizing a Josephson element according to the present invention.

FIG. 8 shows a circuit employing a Josephson element according to another embodiment of the present invention. In FIG. 8, on a substrate formed by such dielectric material as Si, a superconductor layer 22 formed by such material as Nb, and a semiconductor layer 23 formed by such material as InSb are laminated and patterned. The two layers in conjunction form a superconductor wiring.

On this wiring layers, an inter-layer insulation layer 24 is formed by such material as $SiO_2$. And thereon, a resistance layer 27 formed by such material as Mo and a protection layer 28 of the resistance layer formed by such material as $SiO_2$ are formed and patterned. A semiconductor layer 25 formed by such material as InSb is formed further thereon and patterned. Then, a necessary opening which perforates the semiconductor layer 25 and the inter-layer insulation layer 24 is formed. Part of the semiconductor layer 23 which is exposed by the opening, then, is removed, and a superconductor layer 26 of such material as Nb is formed thereon.

After forming a wiring layer to connect resistance in this way, a tunnel barrier for a Josephson junction is formed in such a way that an aluminium layer 31 having an aluminium oxide film is formed on a part of the surface of the superconductor layer 26.

After forming and patterning a superconductor 32 which acts as the other electrode of Josephson junction thereon, the surface is covered with an insulator layer 33 of such material as $SiO_2$. After perforating the insulator layer 33 at a required point, a superconductor layer 34 of such material as Nb which acts as an upper wiring layer is formed thereon.

In this configuration, a wiring which connects the Josephson element and the resistance, a wiring which connects the resistance and a ground wiring, and the ground wiring are formed by wirings which is formed by laminating the superconductor layer and the semiconductor layer.

Since the semiconductor layers are formed by InSb which has a small effective mass and a high mobility, this multiple wiring layer in superconducting state provides a wiring with no loss and no distortion, and with a high propagation velocity.

Description has been given for the case of using a laminate of superconductor layers and semiconductor layers as wiring within an integrated circuit. However, in an electronic circuit, signal is transmitted not only within an integrated circuit but also among integrated circuits and among integrated circuit and terminals or other parts of the circuit. In many cases, wirings among integrated circuits and so on is longer than those within.

Figure 9:
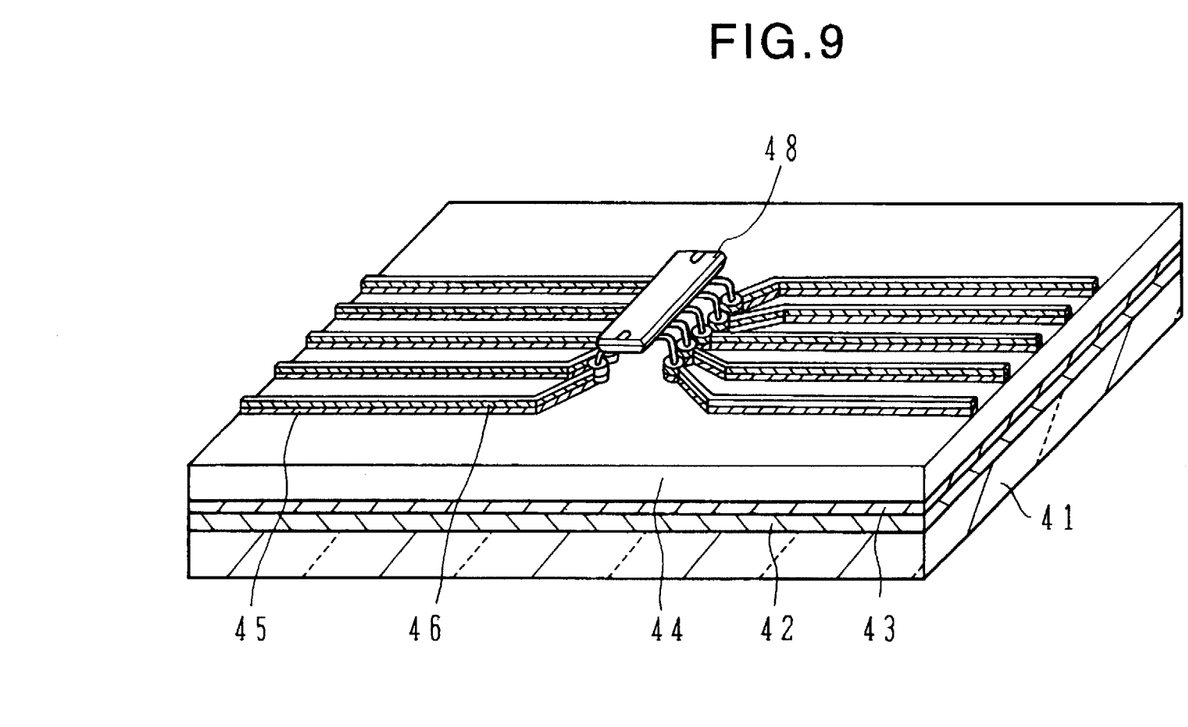
FIG. 9 is an oblique view showing a structure of wiring substrate according to the present invention.

FIG. 9 shows a configuration which employs a complex wiring layer of semiconductor layers and superconductor layers as wirings among integrated circuits.

FIG. 9, on a substrate 41 formed by a sapphire, a superconductor Layer 42 formed by YBCO and a semiconductor layer 43 with a high mobility formed by GaAs are laminated to constitute a ground wiring layer. On the ground wiring layer a dielectric layer 44 formed by $CeO_2$ is formed to constitute a dielectric layer between an upper wiring and a lower wiring.

On the dielectric layer 44 a patterned layer of a semiconductor layer 45 with a high mobility formed by GaAs is formed, and a patterned layer of a superconductor layer 46 formed by YBCO thereon. Pins of IC 48 are connected to this wiring layer.

Figure 10:
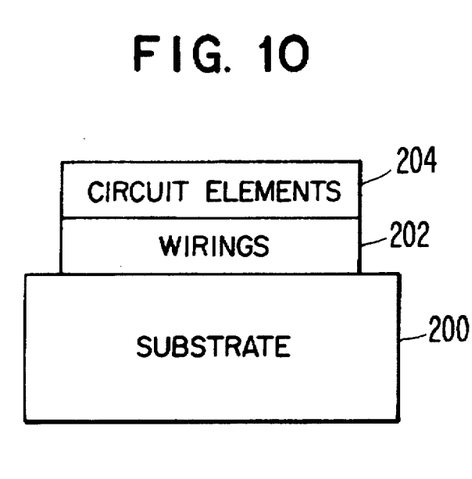
FIG. 10 is a diagram showing a wiring structure according to the present invention.

FIG. 10 is a diagram showing a wiring structure according to the above embodiments of the present invention. As illustrated in FIG. 10, a wiring substrate 200 has wirings 202 formed thereon. In accordance with the previously described embodiments, the wiring substrate 200 is made of a dielectric material, and the wirings 202 comprise a superconductive wiring having a first wiring formed of a superconductor and a second wiring formed of a semiconductor. Further, in accordance with the previously described embodiments, circuit elements 204 are formed on the wirings 202, and the circuit elements 204 may be a semiconductor integrated circuit device having pins connected to the wirings 202.

Thus, by employing a laminated structure formed by superconductor and semiconductor as wirings on a circuit substrate, it is possible to provide wirings with a remarkably high propagation velocity and with no loss and no distortion.

When InSb with a carrier density of $5\times10^{17}$ cm$^{-3}$ is used as a semiconductor, coherent length of the semiconductor is about 30 nm. At the depth equal to this coherent length, the level of superconduction is reduce to about half the initial value. The level of superconduction continues further over the coherent length. It is effective to use a superconducting siring with a thickness 3 to 5 times this coherent length.

Coherent length varies with a carrier concentration within a semiconductor, with the kind of semiconductor, and so on. Considering manufacturing technique and so on, it is preferable to set a value of thickness less than 300 nm, and more preferably to 100 nm.

Embodiments of the present invention include an electronic circuit device comprising a wiring substrate formed by a dielectric material as illustrated in FIGS. 1A, 1B and 3–10. A plurality of wirings are formed on the wiring substrate and comprise first wirings formed by a superconductor material and second wirings arranged adjacent to the first wirings and formed by a semiconductor material. Also, a semiconductor integrated circuit device has a plurality of pins connected to the plurality of wirings. Each of the second wirings has smaller penetration length of magnetic field than that for each of the first wirings. Each of the second wirings has a form of an extended strip and each of the first wirings covers lateral surfaces and an upper surface of the corresponding second wiring. Each of the first wirings are essentially consisting of Nb or NbN, and each of said second wirings are essentially consisting either InSb, InAs, GaAs, InP, or a mixed crystal thereof.

Further, according to embodiments of the present invention, each of the second wirings comprise an electron carrying layer formed by a semiconductor material having a low concentration of impurity and a comparatively narrow band gap; and an electron supplying layer formed by a semiconductor material, arranged adjacent to the electron carrying layers, doped to be of n-type, and having a comparatively wide band gap.

According to embodiments of the present invention, a dielectric layer is arranged between the substrate and the first and second wirings. A third wiring part is arranged between the dielectric layer and the substrate and is formed by a superconductor material. A fourth wiring part is arranged adjacent to the third wiring part and between the dielectric layer and the substrate, formed by a semiconductor material, and becomes at least partly superconductive due to the proximity effect. Metal intermediate layers are arranged between each of the first and second wiring parts.

Moreover, according to embodiments of the present invention, resistances are connected to each of the first wiring parts and to each of the second wiring parts. Josephson elements are connected to each of the first wiring parts and to each of the second wiring parts. Resistances are connected to each of the first wiring parts and to each of the second wiring parts.

The present invention is described above in relation to embodiments. But the present invention is not limited to what has been described in embodiments. It will be apparent to those skilled in arts will be possible to amend, improve, associate and so on within the scope of claims of the present invention.

I claim:

1. A superconductor device comprising:
    a substrate;
    a first wiring part arranged onto said substrate and made of a superconductor material; and
    a second wiring part made of a non-oxide semiconductor material selected from the group consisting of InSb, InAs, GaAs, InP, and mixed crystals thereof, arranged onto said substrate adjacent to said first wiring part and extending along said first wiring part parallel to the direction of current flow through said first wiring part, and jointly forming a first superconductive wiring with said first wiring part by becoming at least partly superconductive due to proximity effect with said first wiring part, wherein said second wiring part has a smaller penetration length of magnetic field than that for said first wiring part.

2. A superconductor device according to claim 1, wherein
    said substrate has a main surface above which said first wiring part and said second wiring part are arranged,
    said second wiring part is between said first wiring part and the main surface of said substrate and forms a strip having a bottom surface facing the main surface of said substrate, a top surface and side surfaces extending from the top surface to the bottom surface, and
    said first wiring part covers the side surfaces and the top surface of said second wiring part.

3. A superconductor device according to claim 1, wherein
    said first wiring part is made of a material selected from the group consisting of Nb and NbN.

4. A superconductor device according to claim 1, wherein said second wiring part comprises
    an electron transport layer formed of a semiconductor material having a low concentration of impurity and a comparatively narrow band gap, and
    an electron supplying layer adjacent to said electron transport layer and formed of a semiconductor material which is doped to be of n-type and having a comparatively wide band gap.

5. A superconductor device according to claim 1 further comprising:
    a dielectric layer arranged between said substrate and said first wiring part, and between said substrate and said second wiring part;
    a third wiring part arranged between said dielectric layer and said substrate and made of a superconductor material; and
    a fourth wiring part
        arranged adjacent to said third wiring part, between said dielectric layer and said substrate and between said dielectric layer and said third wiring part, made of a semiconductor material, and
        jointly forming a second superconductive wiring with said third wiring part by becoming at least partly superconductive due to proximity effect with said third wiring part.

6. A superconductor device according to claim 1, further comprising a metal intermediate layer arranged between said first and said second wiring parts.

7. A superconductor device according to claim 1, further comprising a resistance connected to said first superconductive wiring.

8. A superconductor device according to claim 1, further comprising a Josephson junction element connected to said first superconductive wiring.

9. A superconductor device according to claim 8, further comprising a resistance connected to said first superconductive wiring.

10. A electronic circuit device comprising:
    a substrate made of a dielectric material;
    a plurality of first superconductive wirings formed on said substrate, each first superconductive wiring comprising
        a first wiring part made of a superconductor material and arranged onto said substrate, and
        a second wiring part which corresponds to the first wiring part of the respective first superconductive wiring and is arranged adjacent to the corresponding first wiring part with the first and second wiring parts being parallel to the direction of current flow through the first wiring part, the second wiring part being made of a non-oxide semiconductor material selected from the group consisting of InSb, InAs, GaAs, InP and mixed crystals thereof and forming the respective first superconductive wiring with the corresponding first wiring part by becoming at least partly superconductive due to proximity effect with the corresponding first wiring part, said second wiring part having a smaller penetration length of magnetic field than that for said corresponding first wiring part; and
    a plurality of pins which are respectively connected to said plurality of first superconductive wirings.

11. An electronic circuit device according to claim 10, wherein
    said substrate has a main surface above which said first wiring parts and said second wiring parts are arranged,
    each of said second wiring parts is between said corresponding first wiring part and the main surface of said substrate and forms a strip having a bottom surface facing the main surface of said substrate, a top surface and side surfaces extending from the top surface to the bottom surface, and
    each of said first wiring parts covers the side surfaces and the top surface of the corresponding second wiring part.

12. An electronic circuit device according to claim 10, wherein
    each of said first wirings is made of a material selected from the group consisting of Nb and NbN.

13. An electronic circuit device according to claim 10, wherein each of said second wiring parts comprises:
    an electron transport layer formed of a semiconductor material having a low concentration of impurity and a comparatively narrow band gap, and
    an electron supplying layer adjacent to said electron transport layer and formed of a semiconductor material which is doped to be of n-type and having a comparatively wide band gap.

14. An electronic circuit device according to claim 10, further comprising:

a dielectric layer arranged between said substrate and said second wiring parts;

a plurality of second superconductive wirings, each of said plurality of second superconductive wiring comprising
- a first wiring part arranged between said dielectric layer and said substrate and made of a superconductor material, and
- a second wiring part corresponding to the first wiring part of the respective second superconductive wiring, arranged adjacent to said corresponding first wiring part and between said dielectric layer and said substrate, made of a semiconductor material, and jointly forming the respective second superconductive wiring with said corresponding first wiring part by becoming at least partly superconductive due to proximity effect with the corresponding first wiring part.

15. An electronic circuit device according to claim 10, further comprising metal intermediate layers arranged between each of said first wiring parts and the corresponding second wiring parts.

16. An electronic circuit device according to claim 10 further comprising resistances respectively corresponding to, and respectively connected to, said first superconductive wirings so that each resistance is connected to the corresponding first superconductive wiring.

17. An electronic circuit device according to claim 10, further comprising Josephson junction elements respectively corresponding to, and respectively connected to, said first superconductive wirings so that each Josephson junction element is connected to the corresponding first superconductive wiring.

18. An electronic circuit device according to claim 17, further comprising resistances respectively corresponding to, and respectively connected, said first superconductive wirings so that each resistance is connected to the corresponding first superconductive wiring.

19. A electronic circuit device comprising:

a substrate made of a dielectric material;

a plurality of first superconductive wirings formed on said substrate, each first superconductive wiring comprising
- a first wiring part made of a superconductor material and arranged onto said substrate, and
- a second wiring part which corresponds to the first wiring part of the respective first superconductive wiring and is arranged adjacent to the corresponding first wiring part, the second wiring part being made of a non-oxide semiconductor material and forming the respective first superconductive wiring with the corresponding first wiring part by becoming at least partly superconductive due to proximity effect with the corresponding first wiring part, said second wiring part having a smaller penetration length of magnetic field than that for said corresponding first wiring part;

a plurality of pins which are respectively connected to said plurality of first superconductive wirings;

a dielectric layer arranged between said substrate and said second wiring parts; and a plurality of second superconductive wirings, said dielectric layer being between said plurality of first superconductive wirings and said plurality of second superconductive wirings, each of said plurality of second superconductive wiring comprising
- a first wiring part arranged between said dielectric layer and said substrate and made of a superconductor material, and
- a second wiring part corresponding to the first wiring part of the respective second superconductive wiring, arranged adjacent to said corresponding first wiring part and between said dielectric layer and said substrate, made of a semiconductor material, and jointly forming the respective second superconductive wiring with said corresponding first wiring part by becoming at least partly superconductive due to proximity effect with the corresponding first wiring part.

* * * * *

UNITED STATES PATENT AND TRADEMARK OFFICE
CERTIFICATE OF CORRECTION

PATENT NO. : 5,760,463
DATED : June 2, 1998
INVENTOR(S) : Tsunehiro HATO

It is certified that error appears in the above-identified patent and that said Letters Patent is hereby corrected as shown below:

Col. 1, line 32, delete ",";
line 34, change "Wir-" to --wir- --;
line 57, change "Layer" to --layer--;
line 62, change "With" to --with--.

Col. 2, line 38, change "super positions" to --superpositions--.

Col. 3, line 34, delete the present equation and insert therefore the following:
$$V_{ph} = V_{gr} = (\mu 0 \epsilon)^{\ast}[1 + (2\lambda/d) \coth(b/\lambda)]^{-1/2}$$

Col. 4, line 21, delete "which allow current i to flow therethrough";
line 22, delete ",";
line 23, after "therethrough" insert --,-- and delete "and allow current I to flow";
line 24, delete "therethrough";
line 33, change "12" to --L2--;
line 46, change "an di" to --and--;
line 58, change "With" to --with--.

Col. 5, line 14, change "Oil" to --On--;
line 19, change "ayer" to --layer--;
line 23, change "tip" to --up--.

Col. 6, line 8, change "all" to --an--;
line 28, delete "(".

Col. 7, line 3, delete "." (second occurrence);
line 62, change "Layer" to --layer.

UNITED STATES PATENT AND TRADEMARK OFFICE
CERTIFICATE OF CORRECTION

PATENT NO. : 5,760,463
DATED : June 2, 1998
INVENTOR(S) : Tsunehiro HATO

It is certified that error appears in the above-identified patent and that said Letters Patent is hereby corrected as shown below:

Col. 8, line 27, change "siring" to --wiring--.

Signed and Sealed this

Tenth Day of November 1998

Attest:

BRUCE LEHMAN

Attesting Officer

Commissioner of Patents and Trademarks